(12) United States Patent
Kim et al.

(10) Patent No.: US 11,751,353 B2
(45) Date of Patent: Sep. 5, 2023

(54) POWER CONVERSION MODULE AND METHOD OF FORMING THE SAME

(71) Applicant: TEXAS INSTRUMENTS INCORPORATED, Dallas, TX (US)

(72) Inventors: Woochan Kim, San Jose, CA (US); Vivek Kishorechand Arora, San Jose, CA (US); David Ryan Huitink, Prairie Grove, AR (US); Hayden Seth Carlton, Fayetteville, AR (US); Fang Luo, Holbrook, NY (US); Asif Imran Emon, Middle Island, NY (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 259 days.

(21) Appl. No.: 17/318,276

(22) Filed: May 12, 2021

(65) Prior Publication Data

US 2022/0029519 A1    Jan. 27, 2022

Related U.S. Application Data

(60) Provisional application No. 63/056,271, filed on Jul. 24, 2020.

(51) Int. Cl.
*H05K 7/14* (2006.01)
*H05K 7/20* (2006.01)
(Continued)

(52) U.S. Cl.
CPC ............ *H05K 7/1432* (2013.01); *H02K 7/14* (2013.01); *H02M 7/003* (2013.01); *H05K 1/112* (2013.01); *H05K 1/144* (2013.01); *H05K 7/209* (2013.01)

(58) Field of Classification Search
CPC . H05K 1/11; H05K 1/112; H05K 1/14; H05K 1/144–147; H05K 7/14;
(Continued)

(56) References Cited

U.S. PATENT DOCUMENTS 6,144,571 A * 11/2000 Sasaki .................. H01L 25/165
                                                                257/E25.031
6,366,467 B1 * 4/2002 Patel ...................... H05K 1/141
                                                                257/691

(Continued)

*Primary Examiner* — Tuan T Dinh
(74) *Attorney, Agent, or Firm* — Ronald O. Neerings; Frank D. Cimino

(57) ABSTRACT

A power conversion module and method of forming the same includes a motherboard having a first surface and a second surface that opposes the first surface. The motherboard includes a first trace that electrically couples a decoupling capacitor mounted on the motherboard to a first pad on the first surface of the motherboard and an output node of a power conversion module. The motherboard includes a via extending through the motherboard that electrically couples a second pad on the first surface of the motherboard and a third pad on the second surface of the motherboard to the output node and a second trace that electrically couples a fourth pad on the second surface of the motherboard and the decoupling capacitor. The power module includes a first daughterboard mounted on the first surface of the motherboard and a second daughterboard mounted on the second surface of the motherboard.

20 Claims, 5 Drawing Sheets

(51) Int. Cl.
*H02K 7/14* (2006.01)
*H02M 7/00* (2006.01)
*H05K 1/14* (2006.01)
*H05K 1/11* (2006.01)

(58) Field of Classification Search
CPC ... H05K 7/209; H05K 7/1432; H02M 1/0048; H02M 7/003; H02M 7/5387
USPC .......................................... 361/784–795, 803
See application file for complete search history.

(56) References Cited

U.S. PATENT DOCUMENTS

| | | | |
|---|---|---|---|
| 6,700,795 B1 * | 3/2004 | Jones | H05K 1/141 |
| | | | 361/826 |
| 7,327,569 B2 | 2/2008 | Belady et al. | |
| 7,499,281 B2 | 3/2009 | Harris et al. | |
| 7,558,072 B2 * | 7/2009 | Chen | H05K 1/141 |
| | | | 361/785 |
| 7,800,222 B2 * | 9/2010 | Schulz | H01L 25/162 |
| | | | 257/726 |
| 8,842,438 B2 | 9/2014 | Kim et al. | |
| 10,212,838 B2 | 2/2019 | McPherson et al. | |
| 10,672,663 B2 | 6/2020 | Delacruz et al. | |
| 10,959,319 B2 | 3/2021 | Ma et al. | |
| 2006/0017152 A1 | 1/2006 | White et al. | |
| 2015/0365003 A1 | 12/2015 | Sadwick | |
| 2018/0351472 A1 * | 12/2018 | Dib | H02M 7/003 |
| 2019/0206810 A1 * | 7/2019 | Kanai | H01L 23/60 |

* cited by examiner

POWER CONVERSION MODULE AND METHOD OF FORMING THE SAME

CROSS-REFERENCE TO RELATED APPLICATION

This application claims the benefit of priority to U.S. Provisional Application No. 63/056,271 filed on 24 Jul. 2020, the entirety of which is incorporated herein by reference.

TECHNICAL FIELD

This disclosure relates to power conversion modules.

BACKGROUND

In electrical engineering, power conversion is the process of converting electric energy from one form to another. A power conversion module is an electrical device that includes a power converter that can convert electrical energy. Some power converters convert direct current (DC) into alternating current (AC). Such power converters are sometimes referred to as a DC-to-AC power converter, or more simply as a power inverter. Some power converters convert AC into DC, such power converters are referred to as AC-to-DC power converters. Still other power converters, namely a DC-to-DC power converter converts a source of DC from one voltage level to another voltage level.

Gallium Nitride (GaN) has a relatively high electron mobility and saturation velocity that enables the employment of GaN for high-power and high-temperature microwave applications. High-power/high-frequency devices based on GaN include microwave radio-frequency power amplifiers (such as those used in high-speed wireless data transmission) and high-voltage switching devices for power grids. More particularly, GaN is employable to fabricate GaN field effect transistors (FETs). As compared with a metal-oxide semiconductor field effect transistor (MOSFET), the GaN FET has a lower drain to source resistance when the GaN FET is on ($R_{DS(ON)}$). Also, a GaN FET has lower input capacitance than a MOSFET, such that the GaN FET has a faster on/off switching rate.

SUMMARY

A first example relates to a power conversion module. The power conversion module includes a motherboard having a first surface and a second surface that opposes the first surface. The motherboard includes a first trace that electrically couples a decoupling capacitor mounted on the motherboard to a first pad on the first surface of the motherboard. The motherboard also includes an output node of a power conversion module. The motherboard further includes a via extending through the motherboard that electrically couples a second pad on the first surface of the motherboard and a third pad on the second surface of the motherboard coupled to the output node. The motherboard still further includes a second trace that electrically couples a fourth pad on the second surface of the motherboard and the decoupling capacitor. The power conversion module also includes a first daughterboard mounted on the first surface of the motherboard and coupled to the first pad and the second pad of the motherboard, the first daughterboard including a high side transistor for the power conversion module. The power conversion module further includes a second daughterboard mounted on the second surface of the motherboard and coupled to the third pad and the fourth pad of the motherboard, the second daughterboard including a low side transistor for the power conversion module.

A second example relates to a power conversion module. The power conversion module includes a motherboard having a first surface and a second surface that opposes the first surface. The motherboard includes a first trace that electrically couples a decoupling capacitor mounted on the motherboard to a first pad on the first surface of the motherboard and an output node of a power conversion module. The motherboard also includes a via extending through the motherboard that electrically couples a second pad on the first surface of the motherboard and a third pad on the second surface of the motherboard to the output node. The motherboard further includes a second trace that electrically couples a fourth pad on the second surface of the motherboard and the decoupling capacitor. The power conversion module also includes a high side transistor electrically coupled to the first pad and the second pad of the first surface of the motherboard and a low side transistor for the power conversion module electrically coupled to the third pad and the fourth pad on the second surface of the motherboard. The power conversion module further includes a first thermal substrate thermally coupled to the high side transistor and a second thermal substrate thermally coupled to the low side transistor.

A third example relates to a method for forming a power conversion module. The method includes mounting a first daughterboard to a first surface of a motherboard such that a first trace of the motherboard electrically couples a decoupling capacitor mounted on the motherboard to a high side transistor of a power conversion module on the first daughterboard and the high side transistor is coupled to an output port of the power conversion module, the output node being situated on the motherboard. The method also includes mounting a second daughterboard to a second surface of the motherboard, such that the output node is electrically coupled to a low side transistor of the power conversion module and the low side transistor is electrically coupled to the decoupling capacitor.

DETAILED DESCRIPTION

This disclosure relates to a power conversion module that employs printed circuit board (PCB) and thermal substrate packing techniques to enable three-dimensional (3D) integration of power transistors to curtail a parasitic inductance such that the power transistors are able to switch on (e.g., operate in the linear mode or saturation mode) and off (e.g., operate in the cut-off mode) at or near a upper limit frequency of the power transistors. In some examples, the power transistors are implemented as gallium nitride (GaN) field effect transistors (FETs), but in other examples, other type of transistors, such as gallium oxide (GaO) or silicon carbide (SiC) transistors are also employable.

In some examples, the power module is formed as a stack-up configuration to provide a half-bridge configuration wherein high side transistors are mounted on a first daughterboard that is, in turn, mounted on a first surface of a motherboard (e.g., a top surface) and low side transistors are mounted on a second daughterboard that is, in turn, mounted on a second surface (e.g., a bottom surface) of the motherboard that opposes the first surface of the motherboard. In some examples, this arrangement results in the stack-up configuration wherein the motherboard is sandwiched between the first daughterboard and the second daughterboard. In other examples of the stack-up configuration, some or all power FETs of the power module can be mounted on the motherboard. In any such example, this stack-up configuration provides adequate traces and spacing needed for the power FETs, such as GaN FETs. Additionally, two thermal substrates sandwich the entire stack-up for dual-side cooling. More particularly, one of the two thermal substrates contact the high side transistors, and the other thermal substrate contacts the low side transistors to ensure efficient heat transfer during operation of the power conversion module. The total size of the stack-up (the motherboard, plus the first and second daughterboards, if employed) is adjustable to accommodate spacing constraints (e.g., vertical spacing in one frame of reference). Additionally, the combination of the first daughterboard, the motherboard and the second daughterboard forms a power loop through bumps, making direct contact to an active side of the first and second daughterboards so that the area of the power loop can be diminished.

In some examples, the combination of the motherboard, the first daughterboard and the second daughterboard more generally represent a routable multi-layer substrate. In such a situation, routable multi-layer substrate can be implemented as an insulated metal substrate (IMS) that is thermally enhanced to facilitate heat spreading of dies that include the high side transistors and the low side transistors.

Figure 1:
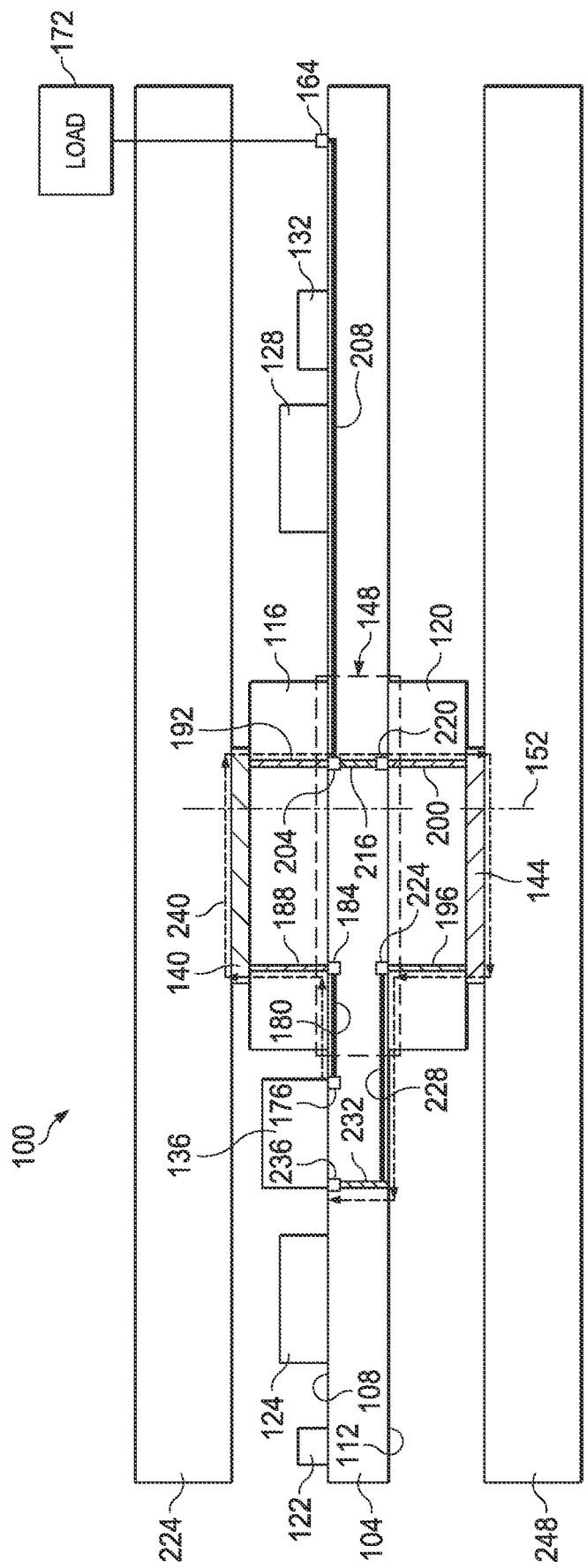
FIG. 1 illustrates a cross-section diagram of an example of a power conversion module formed with three-dimensional (3D) integration.

FIG. 1 illustrates a cross-section diagram of an example of a power conversion module 100 formed with three-dimensional (3D) integration. As one example, the power conversion module 100 is a DC-to-AC converter (inverter), such as a half-bridge power converter or a full bridge power converter. As another example, the power conversion module 100 is a DC-to-DC converter, such as a buck converter (a step-down converter) or a boost converter (a step-up converter). In still other examples, the power conversion module 100 is an AC-to-DC converter. For the examples illustrated, it is presumed that the power conversion module 100 is a DC-to-AC converter.

The power conversion module 100 is fabricated with a plurality of printed circuit boards (PCBs) and/or other substrates to form a three-dimensional (3D) power conversion module that operates at high power, such as up to about 700 volts (V) and up to about 150 amperes (A). More particularly, the power conversion module 100 includes a motherboard 104 that forms a first (main) PCB. In some examples, the motherboard 104 is a laminate formed of a non-conductive material, such as a polycarbonate substrate. The motherboard 104 includes a first surface 108 and a second surface 112. The first surface 108 opposes the second surface 112.

A first daughterboard 116 is mounted on the first surface 108 of the motherboard 104 with solder bumps, and a second daughterboard 120 is mounted on the second surface 112 of the motherboard 104 with solder bumps. In some examples, the first daughterboard 116 and the second daughterboard 120 are laminates formed of a non-conductive material, such as a polycarbonate substrate. Accordingly, the first daughterboard 116, the motherboard 104 and the second daughterboard 120 form a stack-up configuration with wireless bonding. In some examples, the total size of the stack-up (the motherboard 104, plus the first daughterboard 116 and the second daughterboard 120 is selected to accommodate spacing constraints (e.g., vertical spacing in one frame of reference).

In various examples, circuit components are mountable on the first surface 108 and/or the second surface 112 of the motherboard 104. In the example illustrated, circuit components 122, 124, 128 and 132 are included. The circuit components 122, 124, 128 and 132 can represent a voltage regulator, a controller a resistor, a capacitor, an inductor, etc. Moreover, the power conversion module 100 includes a decoupling capacitor 136 that is mounted on the first surface 108 of the motherboard 104. Additionally, the power conversion module 100 includes power transistors. More particularly, the power conversion module 100 includes a high side transistor 140 mounted on or embedded in the first daughterboard 116, and a low side transistor 144 that is mounted on or embedded in the second daughterboard 120. In some examples, the high side transistor 140 and the low side transistor 144 are representative of multiple transistors arranged in parallel or multiple transistors arranged back-to-back. The combination of the motherboard 104, the first daughterboard 116, the second daughterboard 120 can be referred to as a as routable multi-layer substrate. For example, the motherboard 104, the first daughterboard 116, the second daughterboard 120 can be implemented as an insulated metal substrate (IMS) that is thermally enhanced to facilitate heat spreading of dies that include the high side transistor 140 and the low side transistor.

In some examples, the high side transistor 140 and the low side transistor 144 are power transistors, such as high power field effect transistors (FETs). More particularly, in some examples, the high side transistor 140 and the low side transistor 144 are implemented as N channel GaN FETs. In other examples, transistors such as silicon carbide (SiC) FETs or gallium oxide (GaO) FETs are employable as the high side transistor 140 and the low side transistor 144. In still other examples, the high side transistor 140 and the low side transistor 144 are implemented as metal oxide semiconductor field effect transistors (MOSFETs). In still other examples, the high side transistor 140 and the low side transistor 144 are implemented as bi-polar junction transistors (BJTs). Moreover, in examples where the high side transistor 140 and the low side transistor 144 are implemented as GaN FETs, a die that includes the high side transistor 140 and a die that includes the low side transistor 144 are fabricated such that a drain, a source and a gate of the high side transistor 140 and the low side transistor 144 are located on one side (e.g., a topside or bottom side) of the first daughterboard 116 and the second daughterboard 120, respectively.

The first daughterboard 116 and the second daughterboard 120 have the same footprint (e.g., size) and traverse the same region (in 3D space) of the motherboard 104. Accordingly, in the example illustrated, a region 148 of the motherboard 104 is overlaid or underlaid (depending on the perspective) by the first daughterboard 116 and the second daughterboard 120, such that the first daughterboard 116 and the second daughterboard 120 are coextensive from some perspectives (e.g., overhead view). Additionally, a plane 152 that extends perpendicular to the first surface 108 and the second surface of the motherboard 104 passes through the high side transistor 140 and the low side transistor 144. That is, the plane 152 intersects the high side transistor 140, the low side transistor 144 and the motherboard 104.

The high side transistor 140 and the low side transistor 144 each include a control node, an input node and an output node. In examples where the high side transistor 140 and the low side transistor are implemented as a type of FET, the control node represents a gate, the input node represents a drain and the output node represents a source. In examples where the high side transistor 140 and the low side transistor 144 are implemented as BJTs, the control node represents a base, the input node represents a collector and the output node represents an emitter.

The motherboard 104 includes an output terminal 164 configured to be coupled to a load 172. In some examples, the load 172 includes a motor (e.g., an AC motor). Moreover, in some examples, the load 172 is representative of an inductive load that includes an inductor coupled to resistive and/or capacitive components. Additionally, in some examples, the load 172 is external to the power conversion module 100.

The motherboard 104, the first daughterboard 116 and the second daughterboard 120 include features (e.g., traces, vias and pads) to electrically couple the decoupling capacitor 136, the high side transistor 140, the low side transistor 144 and the load 172. That is, the motherboard 104, the first daughterboard 116 and the second daughterboard 120 are coupled with wireless bonding techniques. More particularly, a first node of the decoupling capacitor 136 is coupled to a first pad 176 on the first surface 108 of the motherboard 104. In some examples, such as examples where the power conversion module 100 is a DC-to-AC converter, the first pad 176 can also be conductively coupled to a positive power terminal (e.g., DC+) of the power conversion module. Additionally, a first trace 180 extends between the first pad 176 and a second pad 184 on the first surface 108 of the motherboard 104. The first daughterboard 116 includes a first via 188 and a second via 192 that extends through the first daughterboard 116. Similarly, the second daughterboard 120 includes a first via 196 and a second via 200. In some examples, the high side transistor 140 and the low side transistor 144 are surface mounted IC chips, such as quad flat no-leads (QFN) IC chips. In such examples, the first via 188 and the second via 192 of the first daughterboard 116 and the first via 196 and the second via 200 of the second daughterboard 120 are implemented as through vias.

In other examples, the high side transistor 140 and the low side transistor 144 are embedded as dies in the first daughterboard 116 and the second daughterboard 120, respectively. In these situations, the first daughterboard 116 and the second daughterboard 120 include connection assemblies (e.g., lead frames) for electrically coupling nodes of the high side transistor 140 and the low side transistor 144 with other components. Additionally, in these examples, the first via 188 and the second via 192 of the first daughterboard 116 and the first via 196 and the second via 200 of the second daughterboard 120 are implemented as blind vias that extend partially through the first daughterboard 116 and the second daughterboard 120, respectively.

The first via 188 of the first daughterboard 116 electrically couples the second pad 184 of the motherboard 104 with an input node (e.g., a drain or a collector) of the high side transistor 140. Additionally, the second via 192 electrically couples an output node (e.g., a source or an emitter) of the high side transistor 140 to a third pad 204 of the motherboard 104. The third pad 204 is also electrically coupled to a second trace 208 of the motherboard, wherein the second trace 208 is electrically coupled to an output terminal 164 of the power conversion module 100. The third pad 204 is also referrable to as an output node of the power conversion module 100. In examples where the power conversion module 100 is implemented as a DC-to-AC power conversion module, the output terminal 164 is an AC output terminal that is configured to be coupled to the load 172.

Further, the third pad 204 is coupled to a first via 216 of the motherboard 104. The first via 216 extends between the third pad 204 and a fourth pad 220 that is situated on the second surface 112 of the motherboard 104. The fourth pad 220 is coupled to the second via 200 of the second daughterboard 120. Moreover, the second via 200 of the second daughterboard 120 is coupled to the input node (e.g., a drain or a collector) of the low side transistor 144. In this manner, the input node of the low side transistor 144 is electrically coupled to the output terminal 164 of the power conversion module 100 and the output node of the high side transistor 140.

The output node (e.g., a source or emitter) of the low side transistor 144 is coupled to the first via 196 of the second daughterboard 120. The second via 200 electrically couples the output node of the low side transistor 144 with a fifth pad 224 situated on the second surface 112 of the motherboard 104. A third trace 228 situated on the second surface 112 of the motherboard 104 electrically couples the fifth pad 224 with a second via 232 of the motherboard 104. The second via 232 of the motherboard 104 electrically couples the third trace 228 and a sixth pad 236. The decoupling capacitor 136 is coupled to the sixth pad 236. Moreover, in some examples, such as examples where the power conversion module 100 is implemented as a DC-to-AC power converter, the sixth pad 236 is also coupled to a negative terminal of a power source (e.g., DC−).

As noted, in some examples, the power conversion module 100 includes a controller that is hidden from view for purposes of simplification of explanation. The controller provides a control signal to the control node (e.g., a gate or base) of the high side transistor 140 and the low side transistor 144. The control signals control an operational state of the high side transistor 140 and the low side transistor 144. In particular, the control signals turn the high side transistor 140 and the low side transistor 144 on (e.g., operate in the linear or saturation region) or off (e.g., operate in the cut-off region).

In operation, current flows along a current path between the decoupling capacitor 136 and the load 172. The output terminal 164 is configured to be coupled to the load 172 and an area circumscribed by a current loop for current flowing through the decoupling capacitor 136, the high side transistor 140 and the low side transistor 144 defines a loop area the power conversion module 100. Moreover, a portion of the current path is marked as a current path 240. The current path 240 includes a loop traversing the decoupling capacitor 136, the high side transistor 140, the low side transistor 144 and back to the decoupling capacitor 136. Current flow in the current path 240 is marked with arrows. As is illustrated, opposing legs of the current path 240 flow in opposite directions. For example, as illustrated a first leg of the current loop flowing through the first daughterboard 116 flows in a first direction, and a second leg of the current loop flowing through the second daughterboard 120 flows in a second direction, opposite the first direction. Moreover, by utilizing 3D space to stack the high side transistor 140 and low side transistor 144 such that the plane 152 extends through both the high side transistor 140 and the low side transistor 144, the area circumscribed by the current path 240 is curtailed (e.g., reduced) relative to approaches where transistors are mounted on the same board (e.g., on the same daughterboard or on a single board power conversion module). Curtailment of the area circumscribed by the current path 240 reduces parasitic inductance of the power conversion module 100.

Moreover, in some examples, heat sinks, such as a first thermal substrate 244 is applied to the high side transistor 140 and a second thermal substrate 248 is applied to the low side transistor 144. In some examples, the first thermal substrate and the second thermal substrate are implemented as ceramic substrates, such as respective first and second direct bonded copper (DBC) substrates. The first thermal substrate 244 and the second thermal substrate 248 extract heat from the power conversion module 100 during operation. This extraction of heat increases the available frequency of operation of the power conversion module 100. Additionally or alternatively, the extraction of heat increases a lifetime and/or reliability of the power conversion module 100. For example, if the high side transistor 140 and the low side transistor 144 are implemented as GaN FETs, the power conversion module 100 is operatable at speeds up to about 10 megahertz (MHz), which corresponds to a maximum operational frequency of such GaN FETs. Moreover, in examples where the high side transistor 140 and the low side transistor 144 are implemented as GaN FETs, a die that includes the high side transistor 140 and a die that includes the low side transistor 144 are fabricated such that a drain, a source and a gate of the high side transistor 140 and the low side transistor 144 directly contact the first thermal substrate 244 and the second thermal substrate 248, respectively. This arrangement improves transfer of thermal energy, such that the power conversion module 100 operates efficiently.

Figure 2:
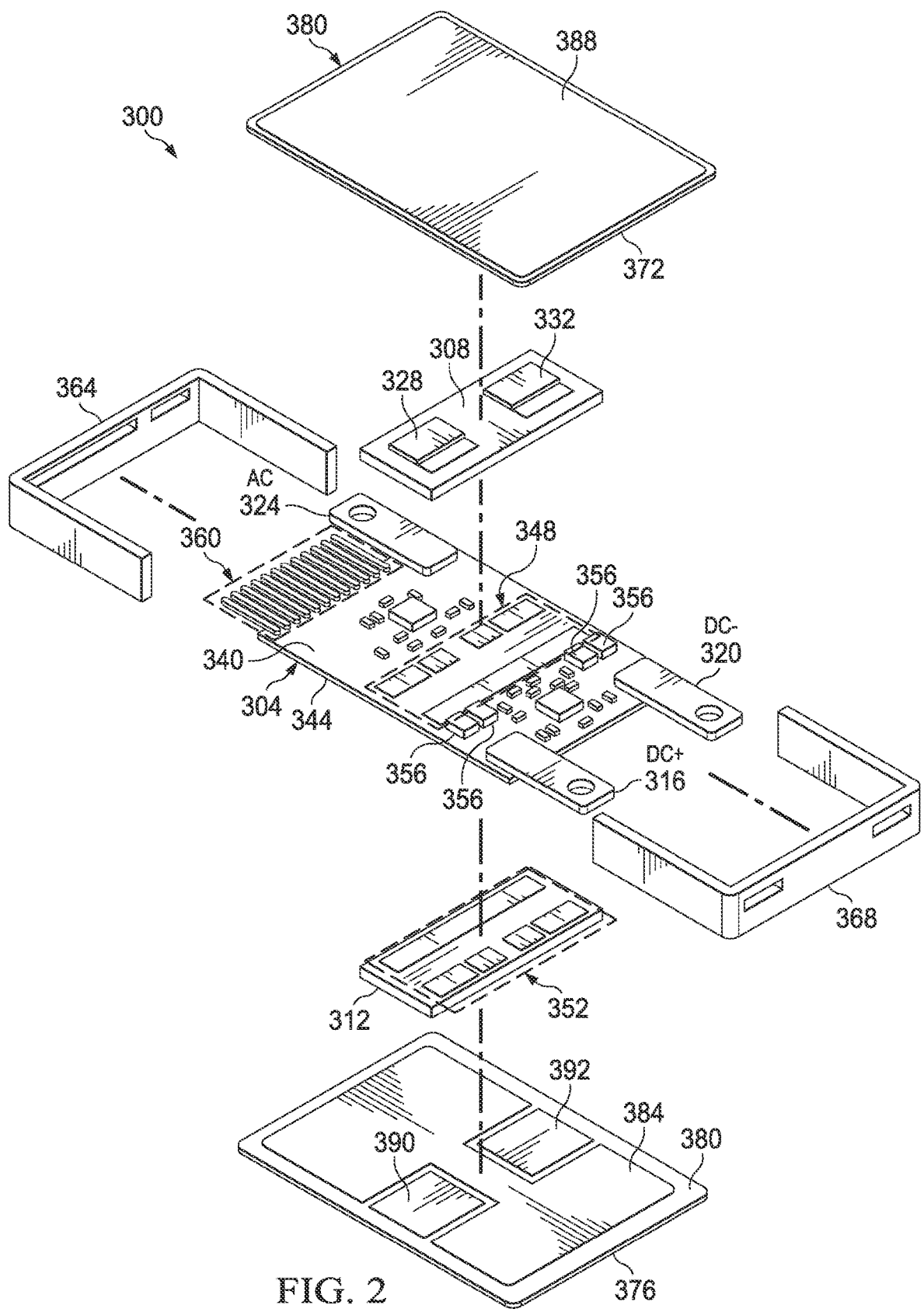
FIG. 2 illustrates an exploded view of a power conversion module formed with 3D integration.
Figure 3:
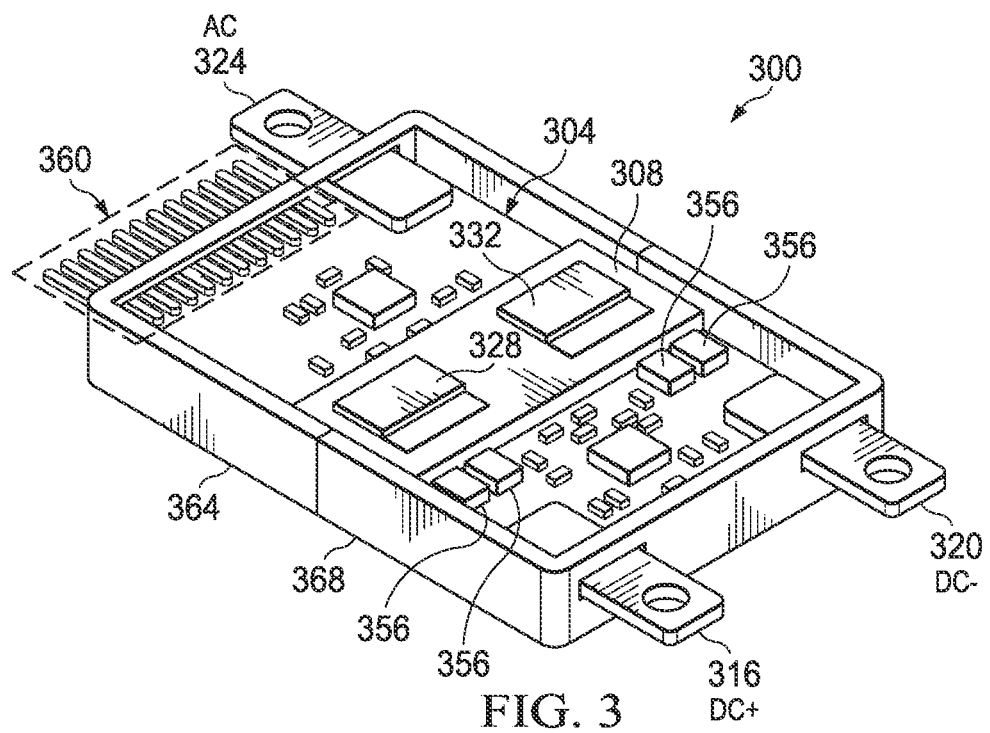
FIG. 3 illustrates a partially assembled view of a power conversion module formed with 3D integration.
Figure 4:
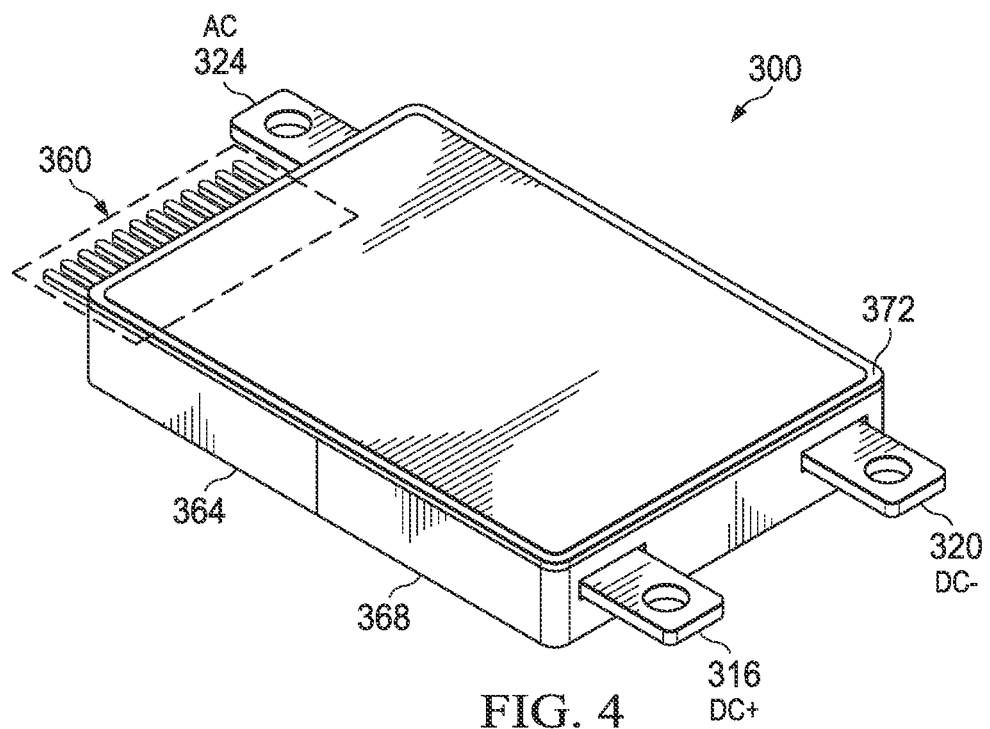
FIG. 4 illustrates a fully-assembled view of a power conversion module formed with 3D integration.

FIGS. 2-4 illustrate different views of a power conversion module 300 formed with three-dimensional (3D) integration. The power conversion module 300 is employable to implement the power conversion module 100 of FIG. 1. More particularly, FIG. 2 illustrates an exploded view diagram of the power conversion module 300. FIG. 3 illustrates a partially assembled view diagram of the power conversion module 300. FIG. 4 illustrates a fully assembled view diagram of the power conversion module 300. For purposes of simplification of explanation, the same reference numbers are employed in FIGS. 2-4 to denote the same structure. The power conversion module 300 illustrated in FIGS. 2-4 implements a half-bridge DC-to-AC converter (e.g., an inverter). However, in other examples, the power conversion module 300 is modified to implement a DC-to-DC converter or an AC-to-DC converter.

The power conversion module 300 includes a motherboard 304, a first daughterboard 308 and a second daughterboard 312. The power conversion module 300 also includes a positive DC input terminal 316 (DC+), a negative DC input terminal 320 (DC−) and an AC output terminal 324 (AC). The first daughterboard 308 and the second daughterboard 312 include power transistors for the power conversion module 300. More specifically, in the example illustrated, the first daughterboard 308 includes a first high side transistor 328 and a second high side transistor 332. The second daughterboard 312 includes a first low side transistor and a second low side transistor that are hidden from view. The first high side transistor 328 and a second high side transistor 332 are employable to implement instances of the high side transistor 140 of FIG. 1. The first low side transistor and the second low side transistor are employable to implement instances of the low side transistor 144 of FIG. 1. Moreover, in other examples, there could be more or less high side transistors and low side transistors.

In some examples, the first high side transistor 328, the second high side transistor 332, the first low side transistor and the second low side transistor are implemented as GaN FETs, such as N-channel GaN FETs. In other examples, transistors such as SiC FETs or GaO FETs are employable as the first high side transistor 328, the second high side transistor 332, the first low side transistor and the second low side transistor. In still other examples, the first high side transistor 328, the second high side transistor 332, the first low side transistor and the second low side transistor are implemented as MOSFETS. In still other examples, the first high side transistor 328, the second high side transistor 332, the first low side transistor and the second low side transistor are implemented as BJTs. Moreover, in examples where the first high side transistor 328, the second high side transistor 332, the first low side transistor and the second low side transistor are implemented as GaN FETs, dies that includes the first high side transistor 328 the second high side transistor 332 the first low side transistor and the second low side transistor are fabricated such that a drain, a source and a gate of these GaN FETs are located on one side (e.g., active side) of the first daughterboard 308 and the second daughterboard 312.

The motherboard 304 include components, such as a controller, resistors, capacitors, inductors, etc. for controlling operations on the power conversion module 300. In particular, the controller is employable to provide control signals to input nodes (e.g., gates or bases) of the first high side transistor 328, the second high side transistor 332, the first low side transistor and the second low side transistor to control an operational state of each such transistor. More particularly, the control signals cause the first high side transistor 328, the second high side transistor 332, the first low side transistor and the second low side transistor to turn off and on (e.g., transition between a cut-off and linear mode or saturation mode).

The motherboard 304 has a first surface 340 and a second surface 344. The first surface 340 includes a first patterned region 348 for mounting the first daughterboard 308. More particularly, the first patterned region 348 exposes pads to mount and electrically couple a matched patterned region of the first daughterboard 308 (hidden from view) to the first surface 340 of the motherboard 304 with bump soldering. Similarly, the second surface 344 includes a similar (e.g., mirror image of the first patterned region 348) patterned region that is hidden from view. The pattern region of the second surface 344 of the motherboard 304 matches a patterned region 352 of the second daughterboard 312 for bump soldering. The motherboard 304 includes decoupling capacitors 356 mounted thereon. The decoupling capacitors 356 are each employable to implement an instance of the decoupling capacitor 136 of FIG. 1. The first daughterboard 308 and the second daughterboard 312 are mountable on the motherboard 304 with solder bumps in a stack-up configuration with wireless bonding. Accordingly, the power conversion module 300 forms a half-bridge configuration. Moreover, by mounting high side power transistors, namely the first high side transistor 328, the second high side transistor 332, the first low side transistor and the second low side transistor on the first surface 340 and the second surface 344 of the motherboard 304, respectively, provides adequate area for traces and spacing needed for the power transistors.

The power conversion module 300 includes auxiliary pins 360 that are employable to receive power supply signals and control signal for components, such as the controller and/or other logic in the power conversion module 300. More particularly, the auxiliary pins 360 enable the power conversion module 300 to be controlled by an external source.

The power conversion module 300 includes a first housing component 364 and a second housing component 368. In some examples, the first housing component 364 and the second housing component 368 are formed of molded plastic (or other polymer). The first housing component 364 includes through holes to receive the auxiliary pins 360 and the AC output terminal 324. The second housing component 368 includes through holes to receive the positive DC input terminal 316 and the negative DC input terminal 320.

FIG. 3 illustrates the power conversion module 300 in a partially assembled state. In FIG. 3, the first daughterboard 308 and the second daughterboard 312 (hidden from view) are mounted on the motherboard 304. Moreover, the first housing component 364 and the second housing component 368 circumscribe a perimeter of the motherboard 304.

Referring back to FIG. 2, the power conversion module 300 includes a first thermal substrate 372 and a second thermal substrate 376. In the example illustrated, the first thermal substrate 372 and the second thermal substrate 376 include a ceramic layer 380 sandwiched between a DBC patterned layer 384 and a DBC plate 388. In at least one perspective the DBC patterned layer 384 of the first thermal substrate 372 and the second thermal substrate 376 are overlaying a first surface of the respective ceramic layer 380. Additionally, in the at least one perspective, the DBC plate 388 is overlaying a second surface of the respective ceramic layer 380. In FIGS. 2-4, the DBC plate 388 of the first thermal substrate 372 is in view, and the DBC plate of the second thermal substrate 376 is hidden from view. Similarly, in FIGS. 2-4 the DBC patterned layer 384 of the second thermal substrate 376 is in view and the DBC patterned layer of the first thermal substrate 372 is hidden from view. Accordingly, the first thermal substrate 372 and the second thermal substrate 376 sandwich the stack-up of the first daughterboard 308, the motherboard 304 and the second daughterboard 312 to enable dual-side cooling.

More particularly, the DBC patterned layer 384 of the second thermal substrate 376 includes a first conductive pad 390 and a second conductive pad 392. The first conductive pad 390 is configured to be in thermal communication with the first low side transistor of the second daughterboard 312. The second conductive pad 392 is configured to be in thermal communication with the second low side transistor. Additionally, the first conductive pad 390 and the second conductive pad 392 are electrically isolated from other regions of the DBC patterned layer 384. The DBC patterned layer 384 of the first thermal substrate 372 includes a first pad and a second pad (hidden from view) configured to be in thermal contact with the first high side transistor 328 and the second high side transistor 332 in a similar manner. Patterning the first thermal substrate 372 and the second thermal substrate 376 in this manner reduces parasitic capacitance induced by the first thermal substrate 372 and the second thermal substrate 376. The ceramic layer 380 of the first thermal substrate 372 and the second thermal substrate 376 are thermally conductive, and electrically isolating. In some examples, the ceramic layer 380 of the first thermal substrate 372 and the second thermal substrate 376 are formed from aluminum oxide ($Al_2O_3$), aluminum nitride (AlN) or diamond. The DBC plate 388 is formed of a continuous layer of copper that thermally dissipates heat to an external source (e.g., air or a heat sink). In this manner, during operation, heat is extracted from the first high side transistor 328, the second high side transistor 332, the first low side transistor and the second low side transistor and dissipated through the DBC plate 388 of the first thermal substrate 372 and the second thermal substrate 376.

FIG. 4 illustrates a fully assembled view of the power conversion module 300. In FIG. 4, the first thermal substrate 372 and the second thermal substrate 376 (hidden from view) are mounted to fully enclose the power conversion module 300. In this manner, the internal components of the power conversion module 300 are electrically isolated. Additionally, as is illustrated, the positive DC input terminal 316, the negative DC input terminal 320, the AC output terminal 324 and the auxiliary pins 360 are still accessible to external systems. In the fully assembled state, in combination, the first housing component 364 and the second housing component 368 form a housing that circumscribing edges of the first thermal substrate 372 and the second thermal substrate 376.

In operation, current flows along a current path between the decoupling capacitors 356 and a load (e.g., the load 172 of FIG. 1) coupled to the AC output terminal 324. Moreover, a portion of the current path flows in a loop traversing the decoupling capacitors 356, the first high side transistor 328 and the second high side transistor 332, the first low side transistor and the second low side transistor and back to the decoupling capacitors 356. An area circumscribed by a current loop for current flowing through the decoupling capacitor 356, the first high side transistor 328 and the second high side transistor 332 to the first low side transistor and the second low side transistor defines a loop area of the power conversion module 300. By utilizing 3D space to form the stack-up configuration, the first high side transistor 328 and the second high side transistor 332 overlay the first low side transistor and the second low side transistor such that the resultant loop area is curtailed (e.g., reduced) relative to approaches where transistors are mounted on the same board (e.g., on the same daughterboard or on a single board power conversion module). Such a reduction of this loop area reduces a parasitic inductance of the power conversion module 300.

Moreover, in some examples, heat sinks are in thermal communication with the first thermal substrate 372 and/or the second thermal substrate 376. Accordingly, the first thermal substrate 372 and/or the second thermal substrate 376 extract heat from the power conversion module 300 during operation. This extraction of heat increases the available frequency of operation of the power conversion module 300. Additionally or alternatively, the extraction of heat increases a lifetime and/or reliability of the power conversion module 300. For example, if the first high side transistor 328, the second high side transistor 332, the first low side transistor and the second low side transistor are implemented as GaN FETs, the power conversion module 300 is operatable at speed up to about 10 MHz, which corresponds to a maximum operational frequency of such GaN FETs.

More generally, the power conversion module employs a hybrid package solution came up using PCBs, namely, the first daughterboard 308, the motherboard 304 and the second daughterboard 312 in a stack-up configuration, sandwiched between the first thermal substrate 372 and the second thermal substrate 376. This stack-up configuration enables 3D integration of the power transistors (e.g., GaN FETs) mounted on or integrated with the first daughterboard 308 and the second daughterboard 312. Thus, as noted, this arrangement curtails a parasitic inductance so that the power transistors, namely the first high side transistor 328, the second high side transistor 332, the first low side transistor and the second low side transistor are operable at or near highest rated switching speed without overheating.

Moreover, as noted, in examples where the first high side transistor 328, the second high side transistor 332, the first low side transistor and the second low side transistor are implemented as GaN FETs, dies that includes these GaN FETs are fabricated such that a drain, a source and a gate of the high side transistor 140 and the low side transistor 144 are located on one side (e.g., an active side) of the first daughterboard 308 and the second daughterboard 312. In these examples, the first thermal substrate 372 directly contacts an active side of the first daughterboard 308 and the second high side transistor 332, and the second thermal substrate 376 directly contacts an active side of the second daughterboard 312 to further improve heat dissipation efficiency during operation of the power conversion module 300.

Figure 5:
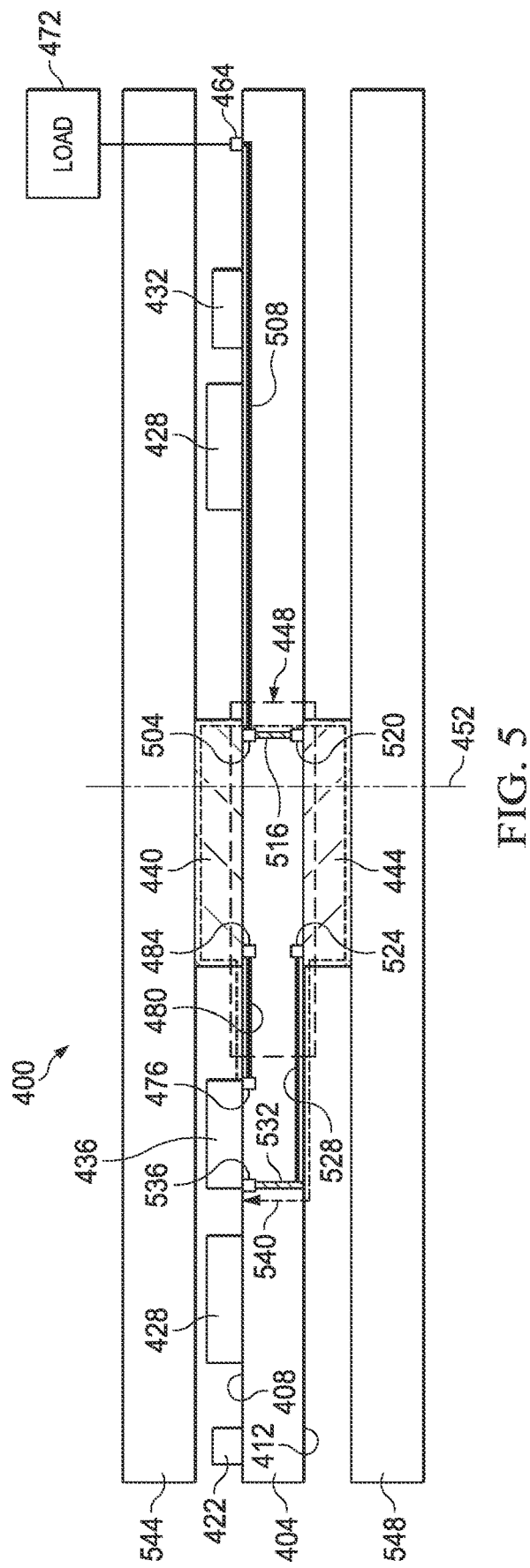
FIG. 5 illustrates a cross-section diagram of another example of a power conversion module formed with 3D integration.

FIG. 5 illustrates a cross-section diagram of an example of a power conversion module 400 formed with 3D integration. As one example, the power conversion module 400 is a DC-to-AC converter (inverter), such as a half-bridge power converter or a full bridge power converter. As another example, the power conversion module 100 is a DC-to-DC converter, such as a buck converter (a step-down converter) or a boost converter (a step-up converter). In still other examples, the power conversion module 400 is an AC-to-DC converter. For the examples illustrated, it is presumed that the power conversion module 400 is a DC-to-AC converter.

The power conversion module 400 is fabricated with a PCB and/or other substrates to form a 3D power conversion module that operates at high power, such as up to about 700 volts (V) and up to about 150 amperes (A). More particularly, the power conversion module 400 includes a motherboard 404 (e.g., a PCB). In some examples, the motherboard 404 is a laminate formed of a non-conductive material, such as a polycarbonate substrate. The motherboard 404 includes a first surface 408 and a second surface 412. The first surface 408 opposes the second surface 412.

In various examples, circuit components are mountable on the first surface 408 and/or the second surface 412 of the motherboard 404. In the example illustrated, circuit components 422, 424, 428 and 432 are included. The circuit components 422, 424, 428 and 432 can represent a voltage regulator, a controller a resistor, a capacitor, an inductor, etc. Moreover, the power conversion module 400 includes a decoupling capacitor 436 that is mounted on the first surface 408 of the motherboard 404. Additionally, the power conversion module 400 includes power transistors. More particularly, the power conversion module 400 includes a high side transistor 440 mounted on the first surface 408 of the motherboard 404, and a low side transistor 444 that is mounted on the second side of the motherboard 404. In some examples, the high side transistor 440 and the low side transistor 444 are representative of multiple transistors arranged in parallel or multiple transistors arranged back-to-back. Accordingly, the high side transistor 440, the motherboard 404 and the low side transistor 444 form a stack-up configuration with wireless bonding.

In some examples, the high side transistor 440 and the low side transistor 444 are power transistors, such as high power FETs. More particularly, in some examples, the high side transistor 440 and the low side transistor 444 are implemented as N channel GaN FETs. In other examples, transistors such as SiC FETs or GaO FETs are employable as the high side transistor 440 and the low side transistor 444. In still other examples, the high side transistor 440 and the low side transistor 444 are implemented as MOSFETs. In still other examples, the high side transistor 440 and the low side transistor 444 are implemented as BJTs. Moreover, in examples where the high side transistor 440 and the low side transistor 444 are implemented as GaN FETs, a die that includes the high side transistor 440 and a die that includes the low side transistor 444 are fabricated such that a drain, a source and a gate of the high side transistor 440 and the low side transistor 444 are located on one side (e.g., a topside or bottom side) of the respective die.

In some examples, dies that include the high side transistor 440 and the low side transistor 444 have the same footprint (e.g., size) and traverse the same region (in 3D space) of the motherboard 404. Accordingly, in the example illustrated, a region 448 of the motherboard 404 is overlaid or underlaid (depending on the perspective) by the high side transistor 440 and the low side transistor 444, such that the high side transistor 440 and the low side transistor 444 are coextensive from some perspectives (e.g., overhead view). Additionally, a plane 452 that extends perpendicular to the first surface 408 and the second surface of the motherboard 404 passes through the high side transistor 440 and the low side transistor 444. That is, the plane 452 intersects the high side transistor 440, the low side transistor 444 and the motherboard 404.

The high side transistor 440 and the low side transistor 444 each include a control node, an input node and an output node. In examples where the high side transistor 440 and the low side transistor are implemented as a type of FET, the control node represents a gate, the input node represents a drain and the output node represents a source. In examples where the high side transistor 440 and the low side transistor 444 are implemented as BJTs, the control node represents a base, the input node represents a collector and the output node represents an emitter.

The motherboard 404 includes an output terminal 464 configured to be coupled to a load 472. In some examples, the load 472 includes a motor (e.g., an AC motor). Moreover, in some examples, the load 472 is representative of an inductive load that includes an inductor coupled to resistive and/or capacitive components. Additionally, in some examples, the load 472 is external to the power conversion module 400.

The motherboard 404, includes features (e.g., traces, vias and pads) to electrically couple the decoupling capacitor 436, the high side transistor 440, the low side transistor 444 and the load 472. More particularly, a first node of the decoupling capacitor 436 is coupled to a first pad 476 on the first surface 408 of the motherboard 404. In some examples, such as examples where the power conversion module 400 is a DC-to-AC converter, the first pad 476 can also be conductively coupled to a positive power terminal (e.g., DC+) of the power conversion module. Additionally, a first trace 480 extends between the first pad 476 and a second pad 484 on the first surface 408 of the motherboard 404. In some examples, the high side transistor 440 and the low side transistor 444 are surface mounted IC chips, such as quad flat no-leads (QFN) IC chips.

The second pad 484 of the motherboard 404 is electrically coupled to the input node (e.g., a drain or a collector) of the high side transistor 440. Additionally, a third pad 504 of the motherboard 404 is electrically coupled to the output node (e.g., a source or an emitter) of the high side transistor 440. The third pad 504 is also electrically coupled to a second trace 508 of the motherboard 404, wherein the second trace 508 is electrically coupled to an output terminal 464 of the power conversion module 400. The third pad 504 is also referrable to as an output node of the power conversion module 400. In examples where the power conversion module 400 is implemented as a DC-to-AC power conversion module, the output terminal 464 is an AC output terminal that is configured to be coupled to the load 472.

Further, the third pad 504 is coupled to a first via 516 of the motherboard 404. The first via 516 extends between the third pad 504 and a fourth pad 520 that is situated on the second surface 412 of the motherboard 404. The fourth pad 520 is coupled to the input node (e.g., a drain or a collector) of the low side transistor 444. In this manner, the input node of the low side transistor 444 is electrically coupled to the output terminal 464 of the power conversion module 400 and the output node of the high side transistor 440.

The output node (e.g., a source or emitter) of the low side transistor 444 is electrically coupled to a fifth pad 524 situated on the second surface 412 of the motherboard 404. A third trace 528 situated on the second surface 412 of the motherboard 404 electrically couples the fifth pad 524 with a second via 532 of the motherboard 404. The second via 532 of the motherboard 404 electrically couples the third trace 528 and a sixth pad 536. The decoupling capacitor 436 is coupled to the sixth pad 536. Moreover, in some examples, such as examples where the power conversion module 400 is implemented as a DC-to-AC power converter, the sixth pad 536 is also coupled to a negative terminal of a power source (e.g., DC−).

As noted, in some examples, the power conversion module 400 includes a controller that is hidden from view for purposes of simplification of explanation. The controller provides a control signal to the control node (e.g., a gate or base) of the high side transistor 440 and the low side transistor 444. The control signals control an operational state of the high side transistor 440 and the low side transistor 444. In particular, the control signals turn the high side transistor 440 and the low side transistor 444 on (e.g., operate in the linear or saturation region) or off (e.g., operate in the cut-off region).

In operation, current flows along a current path between the decoupling capacitor 436 and the load 472. Moreover, a portion of the current path is marked as a current path 540. The current path 540 includes a loop traversing the decoupling capacitor 436, the high side transistor 440, the low side transistor 444 and back to the decoupling capacitor 436. The output terminal 464 is configured to be coupled to the load 472 and an area circumscribed by a current loop for current flowing through the decoupling capacitor 436, the high side transistor 440 and the low side transistor 444 defines a loop area the power conversion module 400. Current flow in the current path 540 is marked with arrows. As is illustrated, opposing legs of the current path 540 flow in opposite directions. For example, as illustrated, a first leg of the current loop flowing the high side transistor 440 flows in a first direction, and a second leg of the current loop flowing through the low side transistor 444 flows in a second direction, opposite the first direction. Moreover, by utilizing 3D space to stack the high side transistor 440 and low side transistor 444 such that the plane 452 extends through both the high side transistor 440 and the low side transistor 444, the loop area (a portion of the area circumscribed by the current path 540) is curtailed (e.g., reduced) relative to approaches where transistors are mounted on a same side of the same board (e.g., on the same side of the motherboard 404). Curtailment of the area circumscribed by the current path 540 reduces parasitic inductance of the power conversion module 400.

Moreover, in some examples, heat sinks, such as a first thermal substrate 544 is applied to the high side transistor 440 and a second thermal substrate 548 is applied to the low side transistor 444. In some examples, the first thermal substrate and the second thermal substrate are implemented as ceramic substrates, such as respective first and second DBC substrates. The first thermal substrate 544 and the second thermal substrate 548 extract heat from the power conversion module 400 during operation. This extraction of heat increases the available frequency of operation of the power conversion module 400. Additionally or alternatively, the extraction of heat increases a lifetime and/or reliability of the power conversion module 400. For example, if the high side transistor 440 and the low side transistor 444 are implemented as GaN FETs, the power conversion module 400 is operatable at speeds up to about 40 MHz, which corresponds to a maximum operational frequency of such GaN FETs. Moreover, in examples where the high side transistor 440 and the low side transistor 444 are implemented as GaN FETs, a die that includes the high side transistor 440 and a die that includes the low side transistor 444 are fabricated such that a drain, a source and a gate of the high side transistor 440 and the low side transistor 444 directly contact the first thermal substrate 544 and the second thermal substrate 548, respectively. This arrangement improves transfer of thermal energy, such that the power conversion module 400 operates efficiently.

As compared to the power conversion module 100 of FIG. 1, the power conversion module 400 omits daughterboards (e.g., the first daughterboard 116 and the second daughterboard 120). To accommodate removal of such daughterboards, components sizes, such as the circuit components 422, 424, 428 and 432 (a voltage regulator, a controller a resistor, a capacitor, an inductor, etc.) are constrained. To accommodate such smaller circuit components 422, 424, 428 and 432, the performance characteristics of the power conversion module 400 are adjusted and/or the cost of the circuit components 422, 424, 428 and 432 is increased. Additionally, in some examples, one daughterboard (the first daughterboard 116 or the second daughterboard 120) is mounted on one side of the motherboard 404. In these examples, some of the components 422, 424, 428 and 432 have increased sizes.

Figure 6:
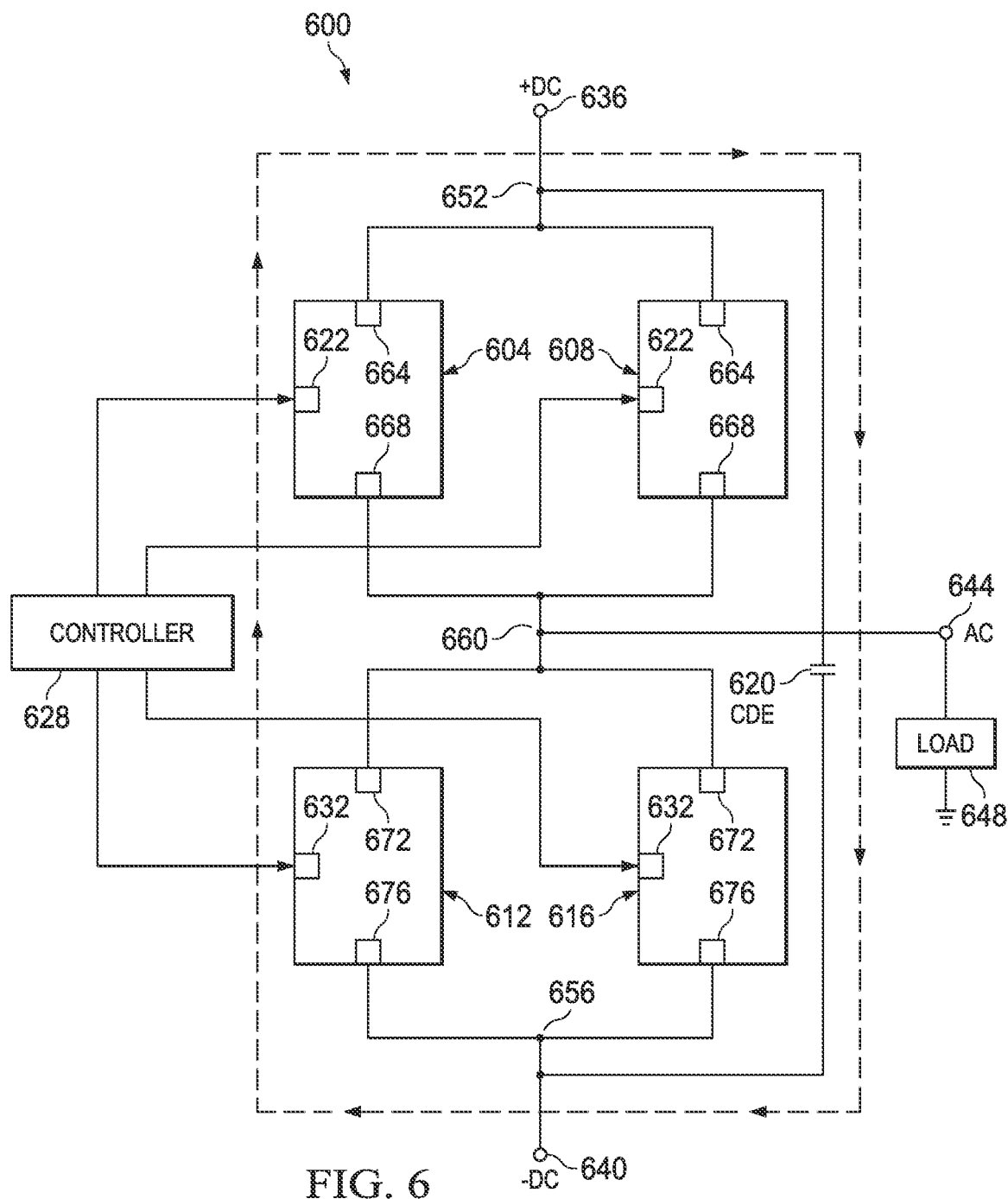
FIG. 6 illustrates a circuit diagram of a power conversion module that implements a direct current (DC) to alternating current (AC) converter.

FIG. 6 illustrates a simplified circuit diagram of a power conversion module 600. The power conversion module 600 is illustrated as a DC-to-AC power converter. Moreover, the power conversion module 600 is employable to implement the the power conversion module 100 of FIG. 1, power conversion module 300 of FIGS. 2-4 and/or the power conversion module 400 of FIG. 5.

The power conversion module 600 includes a first high side transistor 604 and a second high side transistor 608. The first high side transistor 604 and the second high side transistor 608 correspond to the first high side transistor 328 and the second high side transistor 332 of FIGS. 2-4. Thus, the first high side transistor 604 and the second high side transistor 608 are mounted on a first daughterboard, such as the first daughterboard 308 of FIGS. 2-4. The power conversion module 600 also includes a first low side transistor 612 and a second low side transistor 616. The first low side transistor 612 and the second low side transistor correspond to the first low side transistor and the second low side transistor of FIGS. 2-4. Thus, the first low side transistor 612 and the second low side transistor 616 are mounted on a second daughterboard, such as the second daughterboard 312 of FIGS. 2-4. The power conversion module 600 includes a decoupling capacitor 620 that corresponds to one or more of the decoupling capacitors 356 of FIGS. 2-4. The decoupling capacitor 620 is mounted on a motherboard, such as the motherboard 304 of FIGS. 2-4. As illustrated in FIGS. 2-4, the first high side transistor 604 and the second high side transistor 608 overlay the first low side transistor 612 and the second low side transistor 616 in a 3D space. In the example illustrated, it is presumed that the first high side transistor 604, the second high side transistor 608, the first low side transistor 612 and the second low side transistor 616 are GaN FETs. However, in other examples, other types of transistors, such as SiC FETs and GaO FETs, MOSFETS or BJTs are employable.

The first high side transistor 604 and the second high side transistor 608 include a control node 622 (e.g., a gate or a base) that receives a control signal from a controller 628. In some examples, the control signal provided to the control node 622 of the first high side transistor 604 and the control node 622 of the second high side transistor 608 are synchronous. Similarly, the first low side transistor 612 and the second low side transistor include a control node 632 (e.g., a gate or a base) that receives a control signal from the controller 628. In some examples, the control signal provided to the control node 632 of the first low side transistor 612 and the second low side transistor 616 are synchronous. Moreover, in some such examples, the control signal provided to the control node 622 of the first high side transistor 604 and the second high side transistor 608 are complements of the control signal provided to the control node 632 of the first low side transistor 612 and the second low side transistor 616.

In some examples, the controller 628 is mounted on the motherboard. In other examples, the controller 628 is external to the power conversion module 600 and provides control signals through auxiliary pins, such as the auxiliary pins 360 of FIGS. 2-4.

The power conversion module 600 includes a positive DC input terminal 636 that corresponds to the positive DC input terminal 316 of FIGS. 2-4 and a negative DC input terminal 640 that corresponds to the negative DC input terminal 320 of FIGS. 2-4. The power conversion module 600 also includes an AC output terminal 644 that corresponds to the AC output terminal 324 of FIGS. 2-4. Thus, the AC output terminal 644 is configured to be coupled to a load 648 that is external to the power conversion module 600.

The positive DC input terminal 636 is coupled to a first input node 652 of the power conversion module 600. A negative DC input terminal 640 is coupled to a second input node 656 of the power conversion module 600. Additionally, the AC output terminal 644 is coupled to an output node 660 of the power conversion module 600.

A first node of the decoupling capacitor 620 is coupled to the first input node 652 of the power conversion module 600 and a second node of the decoupling capacitor 620 is coupled to the second input node 656. The first high side transistor 604 and the second high side transistor 608 include an input node 664 (e.g., a drain or collector) that is coupled to the first input node 652. The first high side transistor 604 and the second high side transistor 608 include an output node 668 (e.g., a source or emitter) that is coupled to the output node 660.

The first low side transistor 612 and the second low side transistor 616 include an input node 672 (e.g., a drain or collector) that is coupled to the output node 660 of the power conversion module 600. The first low side transistor 612 and the second low side transistor 616 include an output node 676 (e.g., a source or emitter) that is coupled to the negative DC input terminal 640.

In operation, current flows in a current path 680 that traverses the decoupling capacitor 620, the first high side transistor 604, the second high side transistor 608, the first low side transistor 612 and the second low side transistor 616. The current path 680 forms a loop. Curtailing the area circumscribed by the current path 680 reduces parasitic inductance. Thus, by leveraging 3D space (as illustrated in FIGS. 2-4) to overlay the first high side transistor 604 and the second high side transistor 608, the area circumscribed by the current path 680 can be curtailed.

Figure 7:
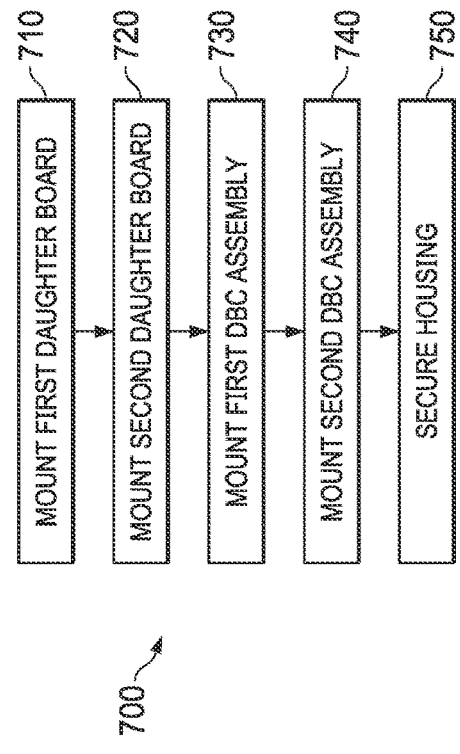
FIG. 7 illustrates a flowchart of an example method for forming a power conversion module.

FIG. 7 illustrates a flowchart of an example method 700 fabricating a power conversion module, such as the power conversion module 100 of FIG. 1, the power conversion module 300 of FIGS. 2-4 and/or the power conversion module 400 of FIG. 4. At 710, a first daughterboard (e.g., the first daughterboard 116 of FIG. 1) is mounted on a first surface of a motherboard (e.g., the first surface 108 of the motherboard 104 of FIG. 1). The first daughterboard is mounted such that a first trace (e.g., the first trace 180 of FIG. 1) of the motherboard electrically couples a decoupling capacitor (e.g., the decoupling capacitor 136 of FIG. 1) mounted on the motherboard to a high side transistor (e.g., the high side transistor 140 of FIG. 1) of the power conversion module that is situated on the first daughterboard. Additionally, the first daughterboard is mounted such that the high side transistor is electrically coupled to an output terminal (e.g., the output terminal 164 of FIG. 1) of the power conversion module, with the output terminal being situated on the motherboard.

At 720, a second daughterboard (e.g., the second daughterboard 120 of FIG. 1) is mounted to a second surface (e.g., the second surface 112 of FIG. 1) of the motherboard. The second daughterboard is mounted such that the output terminal of the power conversion module is electrically coupled to a low side transistor (e.g., the low side transistor 144 of FIG. 1) of the power conversion module and the low side transistor is electrically coupled to a second trace situated on the motherboard (e.g., the third trace 228 of FIG. 1), to electrically couple the decoupling capacitor with the low side transistor. In some examples, the high side transistor and the low side transistor are GaN FETs. In other examples, other types of transistors, such as SiC FETs and GaO FET, MOSFETS or BJTs are employable.

At 730, a first thermal substrate (e.g., the first thermal substrate 372) is mounted on the first daughterboard (e.g., the first daughterboard 308 of FIG. 2). At 740, a second thermal substrate (e.g., the second thermal substrate 376 of FIG. 2) is mounted on the second daughterboard (e.g., the second daughterboard 312 of FIG. 2). At 750, a housing (e.g., the first housing component 364 and the second housing component 368 of FIG. 2) is secured on the power conversion module.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims.

What is claimed is:

1. A power conversion module comprising:
   a motherboard having a first surface and a second surface that opposes the first surface, the motherboard comprising:
   a first trace that electrically couples a decoupling capacitor mounted on the motherboard to a first pad on the first surface of the motherboard;
   an output node of the power conversion module;
   a via extending through the motherboard that electrically couples a second pad on the first surface of the motherboard and a third pad on the second surface of the motherboard coupled to the output node;
   a second trace that electrically couples a fourth pad on the second surface of the motherboard and the decoupling capacitor;
   a first daughterboard mounted on the first surface of the motherboard and coupled to the first pad and the second pad of the motherboard, the first daughterboard comprising a high side transistor for the power conversion module; and
   a second daughterboard mounted on the second surface of the motherboard and coupled to the third pad and the fourth pad of the motherboard, the second daughterboard comprising a low side transistor for the power conversion module.

2. The power conversion module of claim 1, wherein the first daughterboard and the second daughterboard have the same footprint.

3. The power conversion module of claim 2, wherein a plane perpendicular to the first surface and the second surface of the motherboard intersects the high side transistor and the low side transistor.

4. The power conversion module of claim 1, wherein the high side transistor and the low side transistor are gallium nitride (GaN) field effect transistors (FETs).

5. The power conversion module of claim 4, wherein the high side transistor is a component of an integrated circuit (IC) chip mounted on the first daughterboard and the low side transistor is a component of an IC chip mounted on the second daughterboard.

6. The power conversion module of claim 4, wherein the high side transistor is formed on a first die integrated with the first daughterboard and the low side transistor is formed on a second die integrated with the second daughterboard.

7. The power conversion module of claim 1, wherein the output node is configured to be coupled to a load and an area circumscribed by a current loop for current flowing through the decoupling capacitor, the high side transistor and the low side transistor defines a loop area the power conversion module.

8. The power conversion module of claim 7, wherein a first leg of the current loop flows in a first direction through the first daughterboard, and a second leg of the current loop flows in a second direction through the second daughterboard, the second direction being opposite of the first direction.

9. The power conversion module of claim 1, further comprising:
   a first thermal substrate thermally coupled to the first daughterboard; and
   a second thermal substrate thermally coupled to the second daughterboard.

10. The power conversion module of claim 9, wherein the first thermal substrate comprises:
    a direct bonded copper (DBC) patterned layer overlaying a first surface of a ceramic substrate, the DBC patterned layer being in contact with the first daughterboard; and
    a DBC plate overlaying a second surface of the ceramic layer, the DBC plate being electrically isolated from the first daughterboard and in thermal communication with the first daughterboard.

11. The power conversion module of claim 10, further comprising a housing circumscribing edges of the first thermal substrate and the second thermal substrate.

12. The power conversion module of claim 10, wherein the power conversion module is a direct current (DC) to alternating current (AC) power conversion module or a DC-to-DC power conversion module.

13. A power conversion module comprising:
    a motherboard having a first surface and a second surface that opposes the first surface, the motherboard comprising:
    a first trace that electrically couples a decoupling capacitor mounted on the motherboard to a first pad on the first surface of the motherboard;
    an output node of the power conversion module;
    a via extending through the motherboard that electrically couples a second pad on the first surface of the motherboard and a third pad on the second surface of the motherboard to the output node;
    a second trace that electrically couples a fourth pad on the second surface of the motherboard and the decoupling capacitor;
    a high side transistor electrically coupled to the first pad and the second pad of the first surface of the motherboard;
    a low side transistor electrically coupled to the third pad and the fourth pad on the second surface of the motherboard;
    a first thermal substrate thermally coupled to the high side transistor; and
    a second thermal substrate thermally coupled to the low side transistor.

14. The power conversion module of claim 13, wherein a plane perpendicular to the first surface and the second surface of the motherboard intersects the high side transistor and the low side transistor.

15. The power conversion module of claim 13, wherein the high side transistor and the low side transistor are gallium nitride (GaN) field effect transistors (FETs).

16. A method for forming a power conversion module, the method comprising:
    mounting a first daughterboard to a first surface of a motherboard such that a first trace of the motherboard electrically couples a decoupling capacitor mounted on the motherboard to a high side transistor of the power conversion module on the first daughterboard and the high side transistor is coupled to an output node of the power conversion module, the output node being situated on the motherboard; and
    mounting a second daughterboard to a second surface of the motherboard, such that the output node is electrically coupled to a low side transistor of the power conversion module and the low side transistor is electrically coupled to the decoupling capacitor.

17. The method of claim 16, further comprising:
    mounting a first thermal substrate on the power conversion module to contact the first daughterboard; and
    mounting a second thermal substrate on the power conversion module to contact the second daughterboard.

18. The method of claim 17, wherein the first daughterboard and the second daughterboard have the same footprint.

19. The method of claim 18, wherein a plane perpendicular to the first surface and the second surface of the motherboard intersects the high side transistor and the low side transistor.

20. The method of claim 19, wherein the high side transistor and the low side transistor are gallium nitride (GaN) field effect transistors (FETs).

* * * * *